United States Patent [19]

Pacifici et al.

[11] 4,147,603

[45] Apr. 3, 1979

[54] RADIATION CURABLE CELLULOSE COMPOSITIONS

[75] Inventors: James G. Pacifici; Gordon C. Newland, both of Kingsport, Tenn.

[73] Assignee: Eastman Kodak Company, Rochester, N.Y.

[21] Appl. No.: 709,016

[22] Filed: Jul. 27, 1976

[51] Int. Cl.$^2$ .............................. C08L 1/00; C08L 3/00
[52] U.S. Cl. .............. 204/159.12; 260/17 A; 427/54
[58] Field of Search ............ 204/159.12, 159.23; 260/17 A

[56] References Cited

U.S. PATENT DOCUMENTS

| | | | |
|---|---|---|---|
| 3,423,163 | 1/1969 | Magat et al. ............ | 204/159.12 X |
| 3,658,735 | 4/1972 | Nakao et al. ............ | 260/17.4 GC |
| 3,882,057 | 5/1975 | Lindenfors et al. ............ | 260/17 A |
| 3,883,453 | 5/1975 | Takahashi et al. ............ | 260/17 A X |
| 3,988,228 | 10/1976 | Newland et al. ............ | 204/159.12 X |
| 3,992,276 | 11/1976 | Powanda et al. ............ | 204/159.12 X |

*Primary Examiner*—Richard B. Turer
*Attorney, Agent, or Firm*—Donald W. Spurrell; Daniel B. Reece, III

[57] ABSTRACT

Novel radiation-curable coating compositions comprising curable cellulose esters dissolved in unsaturated monomer and containing a photoinitiator. In particular, the cellulose ester contains a β-alkyl amino or β-arylamino carboxylate moiety. Exposure of these compositions to ultraviolet radiation in the presence of ketonic photoinitiators gives clear insoluble coatings which are useful as protective coatings for substrates such as wood, glass, aluminum, and steel.

5 Claims, No Drawings

RADIATION CURABLE CELLULOSE COMPOSITIONS

This invention concerns novel radiation-curable coating compositions comprising a system of curable or crosslinkable-cellulose esters containing certain aminocarboxylate moieties, unsaturated monomer and photoinitiator. These compositions, upon exposure to radiation such as ultraviolet, cure extraordinarily rapidly to give clear, insoluble coatings which are useful as protective coatings for substrates such as wood, glass, aluminum, and steel.

There is an obvious need for coating compositions which require minimal energy input for curing, which cure very rapidly, and which reduce the problem of atmospheric contamination. Recent developments have produced essentially 100% solids coating compositions which are, in essence, reactive compositions essentially free of volatile solvents and containing diluent molecules that react during the curing process to become a part of the protective coating itself. Many such useful nonsolvent coating compositions are known for radiation-curable coatings and include various acrylate and methacrylate esters. The use of such esters, however, frequently leads to problems such as viscosity, requiring the use of thickeners, inadequate flexibility, and excessively long cure periods for modern day production line operations.

It has now been found that cellulose esters, modified with up to two ethylenically unsaturated carboxylate groups per anhydroglucose unit wherein from 10 to 75 mole % of said groups, preferably 15–30 mole %, is β-alkylamino or β-arylamino carboxylate groups, said esters having an inherent viscosity of from about 0.01 to about 2.0 measured by ASTM D-871-56, in admixture (solute-solvent system) particularly with acrylate or methacrylate monomers give coating compositions having suitable viscosities that can be cured very rapidly by high energy radiation such as electron beam or ultraviolet radiation — the latter in the presence of photoinitiators — to give tough, flexible and durable coatings. Such systems require no extrinsic solvent. The ratio of cellulose ester to unsaturated monomer in parts by weight is from 1/20 to 20/1.

The radiation-curable compositions of this invention consist of a cellulsoe ester, modified with an α,β-unsaturated carboxylate group of the formula

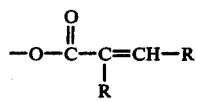

and a β-alkylamino or β-arylamino carboxylate group of the formula

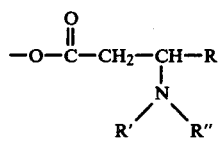

wherein R is selected from H, and methyl, and R' and R" are the same or different and selected from alkyl of 1–8 carbons which may be mono substituted with hydroxyl, phenyl, phenyl substituted with one alkyl group of 1–4 carbons, Cl, Br, or CN, aralkyl wherein the alkyl portion is from 1–4 carbons, and R' and R" taken together may form a cycloalkyl ring including the N, or may form a morpholino ring. Typical and preferred amino groups are:

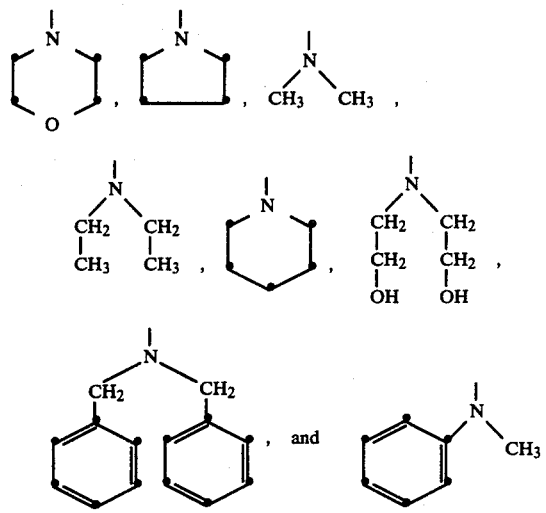

Typical unsaturated carboxylate groups on the cellulose ester are acrylate, methacrylate, and crotonate. Other ester groups, in addition to the unsaturated groups, can be acetate, propionate, butyrate, and mixtures such as acetate-butyrate, acetate-propionate, and acetate-arylate. The degree of esterification of the cellulose may be such that free hydroxyl groups are also present. The cellulose esters of this invention are conveniently prepared by standard esterification reactions of cellulose and partially hydrolyzed cellulose esters. These crosslinkable cellulose esters are used in solutions of the α,β-unsaturated carboxylic acid esters at a concentration dependent upon molecular weight of cellulose ester, structure of monomer, desired application viscosity, and other properties important to the intended end use. A preferred concentration range is 10–60% by weight of cellulose ester based on total weight of cellulose ester and unsaturated monomer.

The α,β-unsaturated carboxylate monomers, preferably acrylates and methacrylates, can be those derived from monohydric and polyhydric alcohols. Typical acrylates are methyl acrylate, butyl acrylate, 2-methoxyethyl acrylate, 2-hydroxyethyl acrylate, 2-hydroxypropyl acrylate, ethyleneglycol diacrylate, neopentyl glycol diacrylate, triethyleneglycol diacrylate, and trimethylol propane triacrylate. The preferred acrylates are the hydroxyethyl and hydroxypropyl derivatives which can be easily prepared from the reaction of ethyleneoxide or propyleneoxide with acrylic acid. It is possible to use these acrylates in combination with other mono- and polyfunctional unsaturated carboxylates. Other ethylenically unsaturated comonomers such as acrylonitrile, styrene and the like can be used with the above systems. The usable amount of such comonomers will depend largely on the solubility of the cellulose derivative in the comonomer itself and compatibility of comonomer with solvent monomer. Likewise, other reactive and nonreactive oligomers can be used in combination with the cellulose derivatives.

The photoinitiators are used in amounts of from 1 to 25% by weight and preferably from 2 to 15% of the total photocurable composition. Typical photoinitiators which are applicable in these systems are benzils, benzoin ethers, halomethyl ketones, aromatic substituted aliphatic ketones, and aromatic ketones. Of special interest herein are benzophenone, fluorenone, xanthone, thioxanthone and acetophenone.

These coating compositions can be applied to substrates with conventional coating equipment. The coated substrates are then exposed to radiation such as ultraviolet light in air or in nitrogen which gives a cured finish. Mercury vapor lamps are applicable for the curing process. Various ways, useful in the present invention, for irradiating the curable material are disclosed in the art as shown, for example, in U.S. Pat. Nos. 3,551,246; 3,558,387; 3,804,631; and British Pat. No. 1,135,280.

The radiation-curable compositions of this invention are suitable as adhesives and coatings for such substrates as metals, plastics, glass, and wood. Moreover, various dyestuffs, pigments, plasticizers, and stabilizers may be incorporated to obtain certain desired characteristics in the finished products and are included in the scope of the invention.

The following examples further illustrate the invention and its advantages but are not intended to limit its scope.

EXAMPLE 1

Cellulose acetate propionate containing 1.9% acetyl, 40.2% propionyl, and approximately 1.0% hydroxyls per AGU was reacted with crotonic anhydride using about a 1/1 by weight mixture of crotonic acid/crotonic anhydride as solvent. The resultant polymer had the following composition: acetyl % 1.6; propionyl % 26.8; crotonyl % 23.1; crotonyl d.s. 1.07; I.V.=0.2. The composition percentages are all by weight.

EXAMPLE 2

Using the procedure described in Example 1, the following compositions were made:

| A. | Acetyl % | 4.3 |
|---|---|---|
|  | Propionyl % | 37.0 |
|  | Crotonyl % | 7.2 |
|  | Crotonyl d.s. | .31 |
|  | I.V. | 1.58 |
| B. | Acetyl % | 3.3 |
|  | Propionyl % | 32.0 |
|  | Crotonyl % | 13.7 |
|  | Crotonyl d.s. | .60 |
|  | I.V. | .28 |
| C. | Acetyl % | 2.8 |
|  | Propionyl % | 27.0 |
|  | Crotonyl % | 24.1 |
|  | Crotonyl d.s. | 1.17 |
|  | I.V. | .36 |
| D. | Acetyl % | 3.2 |
|  | Propionyl % | 25.5 |
|  | Crotonyl % | 23.9 |
|  | Crotonyl d.s. | 1.13 |
|  | I.V. | 0.46 |
| E. | Acetyl % | 1.0 |
|  | Butyryl % | 46.0 |
|  | Crotonyl % | 8.95 |
|  | Crotonyl d.s. | 0.6 |
|  | I.V. | .22 |

EXAMPLE 3

The following general procedure is employed to prepare the amino substituted compositions.

Cellulose ester containing the plain α,β-unsaturated carboxylate group (25 g.) is dissolved in 250 ml of acetone and 1.0 g of acetic acid added. To this mixture is added the desired secondary amine and the mixture refluxed. The solution is cooled to room temperature and poured into water. The precipitated polymer is collected by filtration, washed several times with hot (70°–90° C.) water, and air dried. The concentration of amine on the polymer as milliequivalents per gram of polymer is determined by potentiometric titration. Table I illustrates typical compositions.

Table I

| Sample No. | Cellulose Ester | Amine | Reaction Time (Hr.) | Amine Conc. (Meq/Gram) |
|---|---|---|---|---|
| 1 | Example 1 | Morpholine | 5 | 0.57 |
| 2 | Example 2-A | Morpholine | 5 | .42 |
| 3 | Example 2-B | Morpholine | 5 | .45 |
| 4 | Example 2-C | Morpholine | 5 | .45 |
| 5 | Example 2-D | Morpholine | 5 | .75 |
| 6 | Example 2-E | Morpholine | 5 | .59 |
| 7 | Example 2-C | Diethanolamine | 4 | 0.05 |
| 8 | Example 2-C | Piperidine | 7 | 1.28 |
| 9 | Example 2-C | N-ethylaniline | 20 | 0.14 |

EXAMPLE 4

Samples of each of the compositions listed in Table I were mixed 2-methoxyethylacrylate to give a 15% by weight solution. To each solution was added 2% by weight of benzophenone, and films (1 mil) were cast on glass slides and irradiated for 1 minute with a Gates 420 U11B mercury lamp. All the cured films had a tack-free surface after 1 minute and were insoluble in acetone.

Samples of similar cellulose ester compositions containing the benzophenone initiator but not having an amine moiety do not cure when irradiated under the same conditions.

Although the invention has been described in considerable detail with particular reference to certain preferred embodiments thereof, variations and modifications can be effected within the spirit and scope of the invention.

We claim:

1. A radiation-curable composition comprising cellulose esters having an inherent viscosity of from about 0.01 to about 2.0, modified with up to two ethylenically unsaturated carboxylate groups per anhydroglucose unit, said groups being selected from 60, β-unsaturated carboxylate groups of the formula

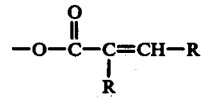

and β-alkylamino or β-arylamino containing carboxylate groups of the formula

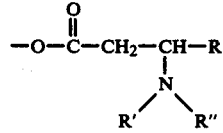

wherein R is selected from H, and methyl, and R' and R'' are the same or different and selected from alkyl of 1–8 carbons which may be mono-substituted with hydroxyl, phenyl, phenyl substituted with one alkyl group of 1–4 carbons, Cl, Br, or CN, aralkyl wherein the alkyl portion is from 1–4 carbons, and R' and R'' taken together may form a cycloalkyl ring including the N, or may form a morpholino ring, wherein from 10 to 75 mole percent of said groups contain the β-alkylamino or β-arylamino moiety, and at least one ethylenically unsaturated monomer selected from α,β-unsaturated carboxylates selected from acrylates, methacrylates, and crotonates, of monohydric and polyhydric alcohols which may be substituted with hydroxy or alkoxy groups, acrylonitrile, and styrene, the weight ratio of cellulose ester to unsaturated monomer being from 1/1 to 10/1.

2. The radiation-curable composition of claim 1 wherein the cellulose ester is selected from esters modified with an α,β-unsaturated carboxylate group of the formula

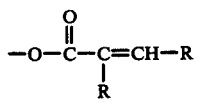

and a β-alkylamino or β-arylamino containing carboxylate group of the formula

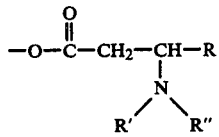

wherein R is selected from H, and methyl, and R' and R" are the same or different and selected from alkyl of 1–8 carbons which may be mono substituted with hydroxyl, phenyl, phenyl substituted with one alkyl group of 1–4 carbons, Cl, Br, or CN, aralkyl wherein the alkyl portion is from 1–4 carbons, and R' and R" taken together may form a cycloalkyl ring including the N, or may form a morpholino ring, and wherein the ethylenically unsaturated monomer is selected from 2-hydroxyethylacrylate, 2-methoxyethylacrylate, 2-hydroxyethylmethacrylate, 2-methoxyethylmethacrylate, 2-hydroxypropylacrylate, butylacrylate and 2-ethylhexylacrylate, the weight ratio of cellulose ester to unsaturated monomer being from 1/1 to 10/1.

3. The composition of claim 2 wherein the amino-containing group is selected from

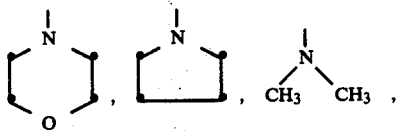

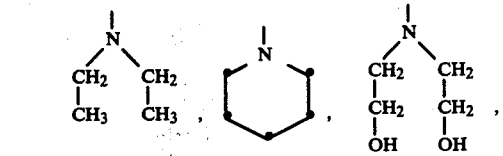

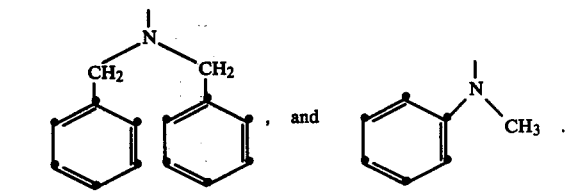

4. The composition of claim 1 containing from about 1 to about 25% by weight of a photoinitiator.

5. The composition of claim 4 containing from 2.0 to 15.0% by weight of a photoinitiator selected from benzophenone, fluorenone, xanthone, thioxanthone and acetophenone.

* * * * *

UNITED STATES PATENT AND TRADEMARK OFFICE
CERTIFICATE OF CORRECTION

PATENT NO. : 4,147,603
DATED : April 3, 1979
INVENTOR(S) : James G. Pacifici and Gordon C. Newland It is certified that error appears in the above—identified patent and that said Letters Patent are hereby corrected as shown below:

Column 4, line 46, "60, β—unsaturated" should read —— α,β—unsaturated—— .

*Signed and Sealed this*

*Sixteenth* Day of *October 1979*

[SEAL]

Attest:

RUTH C. MASON
*Attesting Officer*

LUTRELLE F. PARKER
*Acting Commissioner of Patents and Trademarks*